United States Patent
Li et al.

(10) Patent No.: US 11,444,267 B2
(45) Date of Patent: Sep. 13, 2022

(54) ORGANIC LIGHT EMITTING DEVICE

(71) Applicant: Gu'an Yeolight Technology Co., Ltd., Langfang (CN)

(72) Inventors: Yuhao Li, Langfang (CN); Lixue Guo, Langfang (CN); Jun Wang, Langfang (CN); Jing Xie, Langfang (CN); Yingguang Zhu, Langfang (CN); Yonglan Hu, Langfang (CN)

(73) Assignee: GU'AN YEOLIGHT TECHNOLOGY CO., LTD., Langfang (CN)

( * ) Notice: Subject to any disclaimer, the term of this patent is extended or adjusted under 35 U.S.C. 154(b) by 160 days.

(21) Appl. No.: 16/976,533

(22) PCT Filed: Jul. 10, 2019

(86) PCT No.: PCT/CN2019/095436
§ 371 (c)(1),
(2) Date: Aug. 28, 2020

(87) PCT Pub. No.: WO2020/011202
PCT Pub. Date: Jan. 16, 2020

(65) Prior Publication Data
US 2021/0074956 A1    Mar. 11, 2021

(30) Foreign Application Priority Data

Jul. 12, 2018 (CN) .......................... 201810763668.X
Nov. 22, 2018 (CN) .......................... 201811398407.9

(51) Int. Cl.
*H01L 51/52* (2006.01)
*H01L 51/50* (2006.01)
*H01L 51/00* (2006.01)

(52) U.S. Cl.
CPC ........ *H01L 51/5284* (2013.01); *H01L 51/506* (2013.01); *H01L 51/5076* (2013.01);
(Continued)

(58) Field of Classification Search
CPC .................. H01L 51/5284; H01L 51/506; H01L 51/5076
See application file for complete search history.

(56) References Cited

U.S. PATENT DOCUMENTS

| | | | |
|---|---|---|---|
| 2005/0023966 A1* | 2/2005 | Suh ..................... | H01L 51/5012 313/504 |
| 2005/0062406 A1* | 3/2005 | Kinoshita ........... | H01L 51/5088 257/E21.264 |
| 2012/0012828 A1 | 1/2012 | Koh et al. | |

FOREIGN PATENT DOCUMENTS

| | | |
|---|---|---|
| CN | 1535095 A | 10/2004 |
| CN | 1578561 A | 2/2005 |

(Continued)

*Primary Examiner* — Anthony Ho
(74) *Attorney, Agent, or Firm* — IPro, PLLC (57) ABSTRACT

The organic light emitting device comprises a substrate, a first electrode, an organic layer, a second electrode and a packaging structure which are provided in sequence; the organic layer comprises a light-emitting layer, a hole transport functional layer and an electron transport functional layer located on two sides of the light-emitting layer; a high-energy light sacrificial layer is provided between an electrode corresponding to a light-emergent face of a light-emitting device and the light-emitting layer, and the high-energy light sacrificial layer contains a light absorbing material; a first additional functional layer for avoiding electroluminescence is provided between the high-energy light sacrificial layer and the light-emitting layer.

18 Claims, 5 Drawing Sheets

(52) U.S. Cl.
CPC ........ *H01L 51/005* (2013.01); *H01L 51/0059* (2013.01); *H01L 51/0072* (2013.01); *H01L 51/0077* (2013.01); *H01L 2251/558* (2013.01)

(56) References Cited

FOREIGN PATENT DOCUMENTS

| | | | |
|---|---|---|---|
| CN | 101593813 | A | 12/2009 |
| CN | 108140745 | A | 6/2018 |
| CN | 109473562 | A | 3/2019 |
| CN | 108963094 | B | 6/2020 |
| KR | 100860278 | B1 | 9/2008 |
| TW | 200541102 | A | 12/2005 |

* cited by examiner

ORGANIC LIGHT EMITTING DEVICE

TECHNICAL FIELD

The disclosure herein relates to the field of lighting, specifically to the field of OLED lighting, in particular to an organic light emitting device.

BACKGROUND

OLED (Organic light emitting diode) refers to organic semiconductor materials and light-emitting materials which are driven by an electric field to cause light emitting through carrier injection and recombination. The light-emitting principle of the OLED is using transparent/translucent metal/metal oxide electrodes and metal/metal oxide electrodes as an anode and a cathode of the device, respectively. Under the drive of an external electric field, carriers (electrons and holes) are injected from the cathode and anode into the electron transport functional layer and hole transport functional layer, respectively. Electrons and holes are transferred to the light-emitting layer through the electron transport functional layer and hole transport functional layer, respectively, and an exciton is formed in the light-emitting material. The restricted electron-hole in the excitons disappears after recombination, and the energy is radiated in the form of visible light (emission wavelength is limited by the properties of the light-emitting material). The radiated light can be observed from the transparent/translucent electrode side. This light-emitting principle is widely used in lighting and display screens.

However, most organic materials are sensitive to high-energy light, and light-emitting energy of mainly high-energy light is 2.8-4.1 eV in general environment. Some materials in the OLED device may be attenuated by the high-energy light in the environment. The rule of attenuation is that the product of the illuminance of the high-energy light and the amount of exposure time is close to a fixed value. In the OLED lighting application, a certain ratio of attenuation to the original brightness is defined as the lifetime of the OLED lighting. If OLED devices are exposed to a large amount of high-energy light in the applications (such as automotive or aviation lighting), the high-energy light will accelerate the aging process of the panel and shorten its lifetime.

In order to solve the above problem, the industry's common way is to set components outside the panel that can block high-energy light, and reduce the high-energy light entering the OLED device, and alleviate the degradation of the device, such as using an external cover, anti-UV film, and reflective layer, etc., thereby increasing the lifetime of the OLED panel. However, these ways will introduce new materials or components, increase the process and cost, increase the volume and weight of the product, and even bring new risks.

SUMMARY

The present application aims to solve the above problem that provides an organic light emitting device that can substantially improve the resistance of the OLED device to high-energy light irradiation without affecting the appearance design.

In the first aspect, the present application provides an organic light emitting device including a substrate, a first electrode, an organic layer, a second electrode, and a packaging structure that are sequentially stacked;

wherein the light-emergent face of the organic light emitting device is located on the side of the first electrode or the second electrode, wherein the organic layer comprises a light-emitting layer, a hole transport function layer and an electron transport function layer on both sides of the light-emitting layer;

wherein a high-energy light sacrificial layer is provided between the first electrode or the second electrode where the light-emergent face of the organic light emitting device is located and the light-emitting layer;

wherein a first additional functional layer for avoiding electroluminescence is provided between the high-energy light sacrificial layer and the light-emitting layer.

According to an implementation of the present application, the high-energy light sacrificial layer is comprised of the hole transport function layer or the electron transport function layer as a host doped with a light-absorbing material.

According to an implementation of the present application, the high-energy light sacrificial layer includes the hole transport function layer/electron transport function layer and a light-absorbing material layer located in or on the hole transport function layer/electron transport function layer; the light-absorbing material layer is formed of the light-absorbing material.

According to an implementation of the present application, the light-absorbing material includes at least one of a photoluminescent material, a colored light-absorbing material, and an exciton quenching material.

According to an implementation of the present application, the lowest energy starting position of the absorption spectrum of the photoluminescent material is higher than the highest energy main peak energy position of the emission spectrum of the light-emitting layer material and lower than the optical energy gap of the doped host material of the high-energy light sacrificial layer.

According to an implementation of the present application, the photoluminescent material is any one of a fluorescent material, a phosphorescent material or a quantum dot light-emitting material.

According to an implementation of the present application, the volume percentage of the light-absorbing material in the high-energy light sacrificial layer is more than or equal to 0.1% and less than or equal to 30%.

According to an implementation of the present application, the volume percentage of the photoluminescent material in the high-energy light sacrificial layer is more than or equal to 0.1% and less than or equal to 15%.

According to an implementation of the present application, the volume percentage of the colored light-absorbing material in the high-energy light sacrificial layer is more than or equal to 0.1% and less than or equal to 10%.

According to an implementation of the present application, the volume percentage of the exciton quenching material in the high-energy light sacrificial layer is more than or equal to 2% and less than or equal to 15%.

According to an implementation of the present application, the colored light-absorbing material includes at least one of a salicylate, a benzophenone, a benzotriazole, a substituted acrylonitrile, a triazine, a direct dye, a basic dye, an acid dye, a disperse dye, a reactive dye, a sulfur dye, a vat dye and an cationic dye.

According to an implementation of the present application, the colored light-absorbing material includes at least one of 2-(2'-xenyl 3', 5'-di-pentylphenyl) benzotriazole and 2-xenyl-4-n-octyloxybenzophenone.

According to an implementation of the present application, the exciton quenching material includes at least one of an alkali metal group ionic compound, a metal salt, a metal oxide, a metal, a high electron affinity organic material, an organic metal complex and a carbon material.

According to an implementation of the present application, the exciton quenching material and the host material of the high-energy light sacrificial layer meet the following energy requirements: the gap between the highest occupied molecular orbital of the host material and the lowest unoccupied molecular orbitals of the organic material and/or the organic metal complex is 0.6 eV or less; the work function of the alkali metal ionic compound, the metal salt, the metal oxide, the metal, and the carbon material is lower than the lowest unoccupied molecular orbital of the colored light-absorbing material by more than 0.2 eV.

According to an implementation of the present application, the material of the first additional functional layer has the same charge transport characteristics as the host material of the high-energy light sacrificial layer.

According to an implementation of the present application, the thickness of the first additional function layer is more than or equal to 10 nm and less than or equal to 100 nm.

According to an implementation of the present application, the thickness of the high-energy light sacrificial layer is more than or equal to 30 nm and less than or equal to 250 nm.

In a second aspect, the present application provides a method for manufacturing an organic light emitting device, comprising the following steps: a first electrode, a high-energy light sacrificial layer, a first additional function layer, an light-emitting layer, an electron transport function layer or a hole transport function layer, and a second electrode are sequentially formed on a substrate by any way of vacuum thermal evaporation, wet process, inkjet printing technology, spin coating, and slit coating;

wherein the light-emergent face of the light-emitting layer is located on the side of the first electrode;

alternatively, a first electrode, a high-energy light sacrificial layer, a first additional function layer, an light-emitting layer, an electron transport function layer or a hole transport function layer, and a second electrode are sequentially formed on the substrate by any way of vacuum thermal evaporation, wet process, inkjet printing technology, spin coating, and slit coating;

wherein the light-emergent face of the light-emitting layer is located on the side of the second electrode;

wherein the high-energy light sacrificial layer contains a light-absorbing material that can absorb high-energy light;

wherein the first additional functional layer contains a material that avoids electroluminescence.

In this application, a high-energy light sacrificial layer is provided in a specific position between the light-emitting layer and the electrode layer on the light-emergent face of the organic light emitting device (OLED device), the OLED device is essentially capable of resisting high-energy light, thereby greatly improving the reliability and lifetime of OLED-related products and also increasing the application space.

According to an implementation of the present application, the high-energy light sacrificial layer is provided in the hole transport function layer or electron transport function layer, especially when the high-energy light sacrificial layer is the hole transport function layer or the electron transport function layer doped with a light-absorbing material, the light-absorbing material has the function of blocking high-energy light, this solution improve the ability of the OLED device to absorb high-energy light without affecting original structure and production process of the OLED device. The light-absorbing material adopts at least one of a photoluminescent material, a colored light-absorbing material, and an exciton quenching material, so that the high-energy light sacrificial layer irradiated absorbs external high-energy light and converts it into low-energy light or converts the energy into phonon dissipation. It can significantly improve the effect of the uneven light-emitting of OLED panel caused by the high-energy light and relieve the voltage rise of OLED panel exposed to the high-energy light for a long time.

According to an implementation of the present application, the high-energy light sacrificial layer is provided in the hole transport function layer or electron transport function layer, alternatively, a light-absorbing material layer is located on the hole transport function layer or electron transport function layer; the light-absorbing material layer is formed of light-absorbing material. This method is simple in process and easy to implement.

In the present application, the light-absorbing material in the high-energy light sacrificial layer is mainly selected from at least one of a photoluminescent material, a colored light-absorbing material, and an exciton quenching material. The selection of materials is universal and convenient, and its effect on the efficiency of the original OLED device is below 15%. However, the absorption of high-energy light by this layer can relieve the speed of the voltage rise of the OLED panel exposed to the high-energy light for a long time, make the highest point of the voltage rise of the OLED device lower after exposure to the high-energy light. This is because the attenuation effect of the OLED device is characterized by a decrease of brightness and a rise of voltage in terms of photoelectric performance. Reducing the speed of voltage rise and the highest point of voltage rise is equivalent to increasing the lifetime of the panel. The test shows that the method of the present application increases the lifetime of the panel by at least 30%.

In the present application, a first additional functional layer is provided between the high-energy light sacrificial layer and the light-emitting layer for avoiding electroluminescence, and especially when the additional function layer is made of the host material of the high-energy light sacrificial layer, the effect is better and the process is simpler.

BRIEF DESCRIPTION OF FIGURES

The other features, objects and advantages of this disclosure will become more apparent from the following detailed description of non-limiting embodiments when taken in conjunction with the accompanying drawings.

REFERENCE NUMBERS

10 substrate; 20 first electrode; 30 hole transport function layer; 60 second electrode; 40 light-emitting layer; 50 electron transport function layer; 32 hole transport layer HT; 31 hole injection layer HI; 33 high-energy light sacrificial layer; 52 electron injection layer EI; 51 electron transport layer ET; 70 first additional functional layer; 80 light-absorbing material; 81 light-absorbing material layer.

DETAILED DESCRIPTION

The present application will be further described in detail in conjunction with the drawings and the embodiments. It is understood that specific embodiments described herein are merely illustrative of the relevant disclosure. It should also be noted that, for the convenience of description, only parts related to the present disclosure are shown in the drawings.

It should be noted that the embodiments of the present disclosure and the features in the embodiments may be combined with each other without conflict. The present application will be described in detail below with reference to the accompanying drawings.

Embodiment 1

Figure 1:
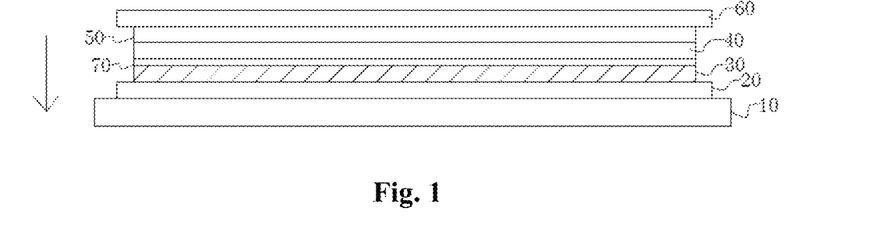
FIG. 1 is a structural schematic diagram of a first embodiment of an organic light emitting device of the present application.
Figure 2:
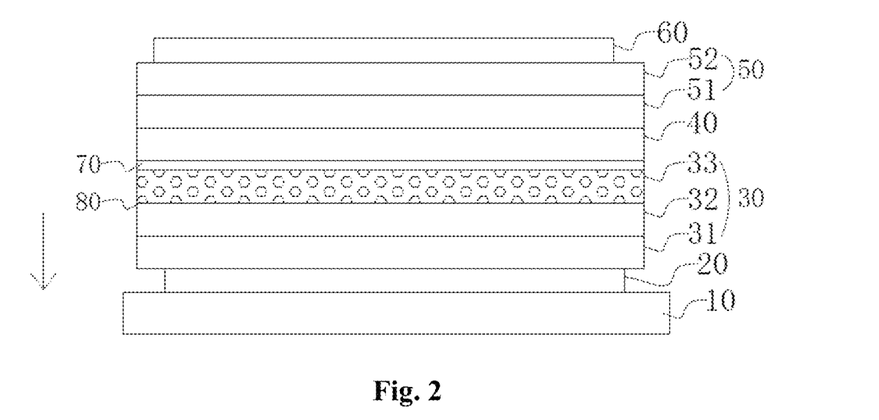
FIG. 2 is a detailed structural schematic diagram of the high-energy light sacrificial layer in the first embodiment of an organic light emitting device of the present application.

FIG. 1 is a structural schematic diagram of a first embodiment of an organic light emitting device of the present application. In this embodiment, the organic light emitting device is an OLED device, including a substrate 10, a first electrode 20, a hole transport function layer 30, a light-emitting layer 40, an electron transport function layer 50, a second electrode 60, and an encapsulation structure (not shown in FIG. 1) that are sequentially stacked; wherein the hole transport function layer 30, the light-emitting layer 40 and the electron transport function layer 50 form an organic layer of the OLED device; wherein the light-emergent face of the organic light emitting device is located on the side of the first electrode 20, a high-energy light sacrificial layer (set in the layer where the diagonal bar is drawn in FIG. 1) is provided between the first electrode 20 and the light-emitting layer 40. The high-energy light sacrificial layer is formed by the hole transport function layer 30 as a host material doped with a light-absorbing material; as shown in FIG. 2, in this embodiment, the hole transport function layer 30 includes a hole injection layer HI 31, a hole transport layer HT 32 and an electron blocking layer EBL, the high-energy light sacrificial layer 33 is formed by the electron blocking layer EBL doped with light-absorbing material 80.

In this embodiment, the light-absorbing material is made of a photoluminescent material, specifically, is made of a fluorescent material; in other embodiments, the light-absorbing material can also be made of other photoluminescent materials, such as a phosphorescent material or a quantum dot light-emitting material (quantum dot material).

In this embodiment, the fluorescent material is made of a red fluorescent material. In other embodiments, the fluorescent material can also be made of a green fluorescent material or a blue fluorescent material, such as C545T (2, 3, 6, 7-Tetrahydro-1, 1, 7, 7,-tetramethyl-1H, 5H, 11H-10-(2-benzothiazolyl) quinolizino [9, 9a, 1gh] coumarin), AND (9, 10-Di (naphth-2-yl) anthracene), DBP (Dibenzo {[f, f']-4, 4', 7, 7'-tetraphenyl} diindeno [1, 2, 3-cd:1', 2', 3'-Im] perylene), Rubrene (5, 6, 11, 12-Tetrapheny Inaphthacene), etc., the fluorescent material can preferably be a thermally delayed fluorescent material, such as 2PXZ-OXD (2, 5-bis (4-(10H-phenoxazin-10-yl) phenyl)-1, 3, 4-oxadiazole). The phosphorescent material can be made of Ir (btp) 2 (acac) (Bis (2-benzo [b] thiophen-2-yl-pyridine) (acetylacetonate) iridium (III)), Ir (mppy) 3 (Tris [2-(p-tolyl) pyridine] iridium (III)), FIrPic (Bis (3, 5-difluoro-2-(2-pyridyl) phenyl-(2-carboxypyridyl) iridium (III)).

The quantum dot light-emitting material can be made of perovskite quantum dots, the normal quantum dot material is the semiconductor nanoparticles which are made of II-VII clan (Cdse, Cds, Znse, Cds, Pbs, Pbse), III-VI clan (InP, InAs), or I-III-VII clan (CuIns2,AgIns2) materials.

The energy gap of the above photoluminescent material is higher than the energy gap of the light-emitting layer and less than the energy gap of the doped host material of the high-energy light sacrificial layer. The above photoluminescent materials will become excited state after absorbing high-energy light. When the energy is transferred from the excited state to the ground state, it is released in the form of luminescence, and this mechanism is called photoluminescence. Since photoluminescence absorbs high-energy light, the light emitted by the photoluminescent material is determined by the characteristics of the photoluminescent material, and the light emitted by the above photoluminescent material after absorbing high-energy light is the blue-green-yellow-red visible light with wavelength range between 500-700 nm, therefore, the high-energy light sacrificial layer can also be called color conversion layer. The light emission wavelength of most OLED devices is between 450 nm-700 nm, and the energy gap of the photoluminescent material is lower than that of the light-emitting layer material, the light emitted by OLED will not be absorbed by the photoluminescence material (color conversion layer).

The volume percentage of the photoluminescent material in the high-energy light sacrificial layer is 10%. In other embodiments, the volume percentage of the photoluminescent material in the high-energy light sacrificial layer is more than or equal to 0.1% and less than or equal to 15%.

A first additional functional layer 70 for avoiding electroluminescence is provided between the high-energy light sacrificial layer 33 and the light-emitting layer 40. The above hole transport function layer 30 is made of a material that have the capability of hole transport. The above electron transport function layer 50 is made of a material that have the capability of electron transport.

To avoid the possibility that the high-energy light sacrificial layer may emit light under driving by an electric field, a first additional functional layer 70 is provided between the high-energy light sacrificial layer and the light-emitting layer, wherein the material of the first additional functional layer 70 and the host material of the high-energy light sacrificial layer have the same charge transport characteristics, which can ensure that there is only a single type of carrier (electron or hole) in the high-energy light sacrificial layer, and achieving the effect of avoiding electroluminescence.

A concept of the same host material is that they have the same charge transport characteristics. In this embodiment, since the light-absorbing material is doped in the hole transport function layer, the first additional functional layer 70 is the material that can realize the function of hole transport, for example, it can be a different type of EBL, such as EBL1, EBL2, or EBL3 etc.

Embodiment 2

Figure 3:
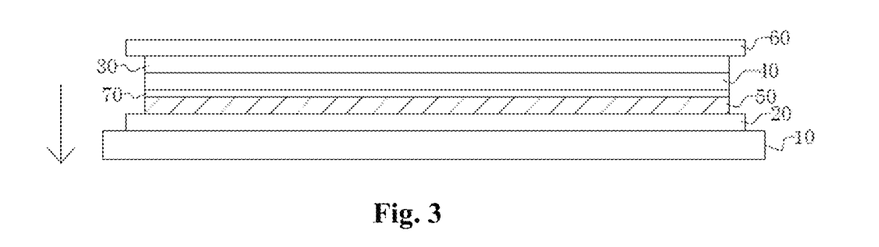
FIG. 3 is a structural schematic diagram of a second embodiment of an organic light emitting device of the present application.

FIG. 3 is a structural schematic diagram of a second embodiment of an organic light emitting device of the present application. Like the embodiment 1, in this embodiment, the OLED is also bottom-emitting type. The differences from embodiment 1 are as follows: in this embodiment, an electron transport function layer 50 is provided between the first electrode 20 and the light-emitting layer 40, and the high-energy light sacrificial layer is formed by the electron transport function layer 50 as a host material doped with light-absorbing material, and the first additional functional layer 70 is provided between the electron transport function layer 50 and the light-emitting layer 40 accordingly.

Figure 4:
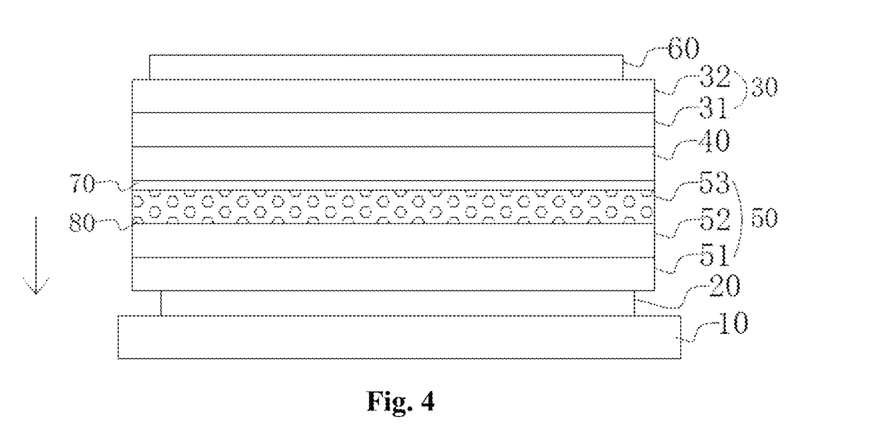
FIG. 4 is a detailed structural schematic diagram of the high-energy light sacrificial layer in the second embodiment of an organic light emitting device of the present application.

The electron transport function layer 50 includes a electron injection layer EI 51, a electron transport layer ET 52 and an hole blocking layer HBL 53. As shown in FIG. 4, the light-absorbing material 80 is doped in the hole blocking layer HBL 53. The high-energy light sacrificial layer is formed by the hole blocking layer HBL53 doped with light-absorbing material 80; the material of the first additional functional layer 70 also belongs to HBL.

Embodiment 3

Figure 5:
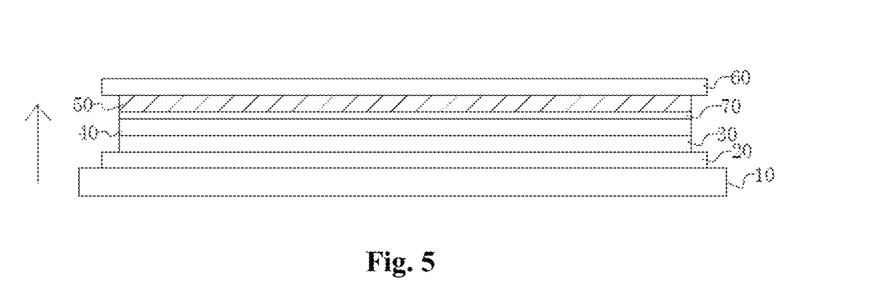
FIG. 5 is a structural schematic diagram of a third embodiment of an organic light emitting device of the present application.

FIG. 5 is a structural schematic diagram of a third embodiment of an organic light emitting device of the present application. The differences from embodiment 2 are as follows: in this embodiment, the OLED is top-emitting type, the electron transport function layer 50 is provided between the light-emitting layer 40 and the second electrode 60. On this occasion, the high-energy light sacrificial layer is formed by the electron transport function layer 50 as a host material doped with light-absorbing material, the first additional functional layer 70 is provided between the electron transport function layer 50 and the light-emitting layer 40 accordingly.

Embodiment 4

Figure 6:
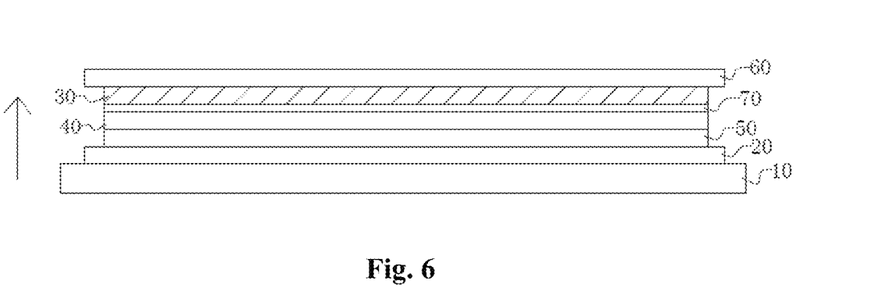
FIG. 6 is a structural schematic diagram of a fourth embodiment of an organic light emitting device of the present application.

FIG. 6 is a structural schematic diagram of a fourth embodiment of an organic light emitting device of the present application. Like the embodiment 3, in this embodiment, the OLED is also top-emitting type. The differences from embodiment 3 are as follows: in this embodiment, the hole transport function layer 30 is provided between the light-emitting layer 40 and the second electrode 60. On this occasion, the high-energy light sacrificial layer is formed by the hole transport function layer 30 as a host material doped with light-absorbing material, and the first additional functional layer 70 is provided between the hole transport function layer 30 and the light-emitting layer 40 accordingly.

The above embodiments 1 to 4 illustrate that the technical solution of the present application is not only applicable to OLED devices with PIN (hole transport function layer-light emitting layer-electron transport function layer) structure, but also applicable to NIP structures (electron transport function layer-light emitting layer-hole transport function layer) OLED devices, not only applicable to bottom-emitting OLED devices, but also applicable to top-emitting OLED devices.

Embodiment 5

Figure 7:
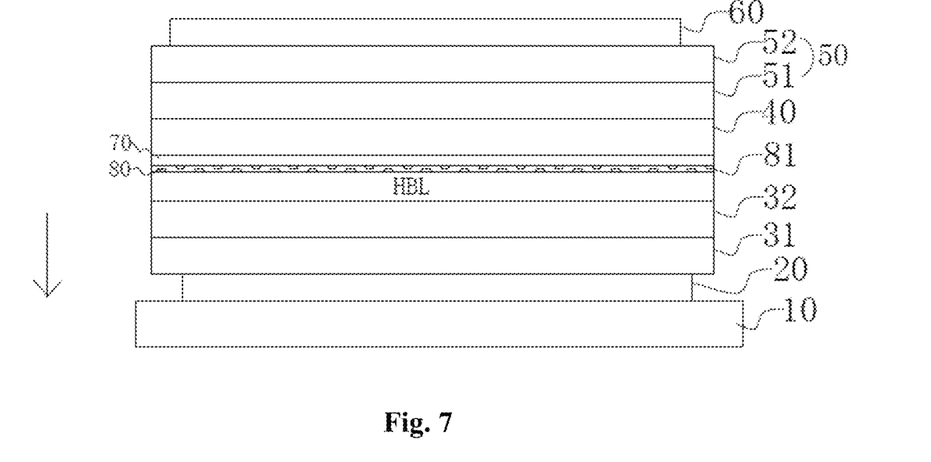
FIG. 7 is a structural schematic diagram of a fifth embodiment of an organic light emitting device of the present application.

As shown in FIG. 7, on the basis of the embodiment 1, the light-absorbing material 80 is configured separately to form a separate light-absorbing material layer 81, and the light-absorbing material layer 81 is located between the light-emitting layer and the electron blocking layer EBL.

Embodiment 6

Figure 8:
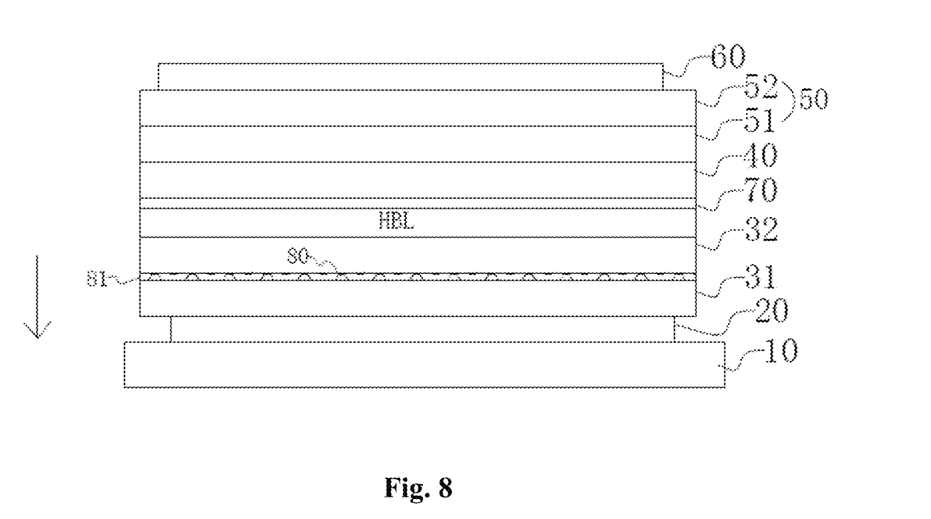
FIG. 8 is a structural schematic diagram of a sixth embodiment of an organic light emitting device of the present application.

As shown in FIG. 8, on the basis of the embodiment 5, in this embodiment, the light-absorbing material layer 81 is located between the hole injection layer H131 and the hole transport layer HT32.

In other embodiments, the light-absorbing material layer 81 also can be located between the electron blocking layer EBL and the hole transport layer HT32. Therefore, the definition of the high-energy light sacrificial layer of this application is: one layer of the hole transport function layer doped with the light-absorbing material, or one layer of electron transport function layer doped with the light-absorbing material, or the superimposed layer of the light-absorbing material layer and the one layer of the hole transport function layer which is close to the side of the light-emitting layer and adjacent to the light-absorbing material layer, or the superimposed layer of the light-absorbing material layer and the one layer of the electron transport function layer which is close to the side of the light-emitting layer and adjacent to the light-absorbing material layer.

Embodiment 7

On the basis of the embodiment 1, the photoluminescent material of the light-absorbing material 80 in the first embodiment is replaced by a colored light-absorbing material, specifically, it is 2-(2'-xenyl 3',5'-di-pentylphenyl) benzotriazole. In other embodiments, for example, the colored light-absorbing material includes at least one of a salopheicylate, a benznone, a benzotriazole, a substituted acrylonitrile, a triazine, a direct dye, a basic dye, an acid dye, a disperse dye, a reactive dye, a sulfur dye, a vat dye and a cationic dye.

The direct dye includes, for example, diaminostilbene disulfonic acids, 4.4'-diaminodiphenylureas, 4.4'-diaminobenzoylanilides, 4.4'-diaminobenzenesulfanilides, diaminoheterocyclics, etc., specifically, such as 2-(2'-xenyl 3',5'-di-pentylphenyl) benzotriazole and 2-xenyl-4-n-octyloxybenzophenone. The acid dye includes, for example, bromine derivatives etc. The colored light-absorbing materials are colored dyes, which can be defined as ultraviolet/near ultraviolet/blue absorbers. Because the main absorption wave band is in the ultraviolet/near ultraviolet/deep blue wave band, the visual appearance of green translucence/yellow translucence/red translucence will appear in the color. The colored light-absorbing material can absorb most of the short-wave high-energy light (more than 60%) below 450 nm, and the absorbed proportion of the blue waveband of 450-500 nm is between 30% and 60%, and the transmittance of the 500 nm-750 nm wave band (the wave band is also the emission wave band of the light-emitting layer) is above 80%, that is to say, the absorbed proportion is below 20%.

Preferably, in this embodiment, the volume percentage of the colored light-absorbing material in the high-energy light sacrificial layer is 5%. In other embodiments, the volume percentage of the colored light-absorbing material in the high-energy light sacrificial layer can be more than or equal to 0.1% and less than or equal to 10%.

Embodiment 8

On the basis of the embodiment 1, an exciton quenching material is further added into the high-energy light sacrificial layer of the first embodiment. On this occasion, the exciton quenching material is used as the second additional functional material, which is doped in the hole transporting functional layer to improve the charge transport ability. The exciton quenching material includes, for example, at least one of an alkali metal group ionic compound, a metal salt, a metal oxide, a metal, a high electron affinity organic material, an organic metal complex and a carbon material, wherein the exciton quenching material can also be other materials with exciton quenching function.

In other embodiments, the exciton quenching material can form a layer alone.

Since the light-emitting materials become excited state after absorbing high-energy light, in addition to releasing energy in the form of light emitting, the energy is also possible to be transferred to the host material (such as the material in the electron transport function layer or hole transport function layer) around the light-emitting material (located in the light-emitting layer). This mechanism may also cause the light-absorbing material in the host (hole/ electron transport or injection material) to accelerate the cracking and cause performance degradation; therefore, the high-energy light sacrificial layer at least includes one kind of the exciton quenching material, which quench the light-emitting material in the excited state in microseconds (us) or in less time. This helps to shorten the time of all the light-emitting materials in unstable excited state, and also increase the life of the light-emitting material, therefore, improving the lifetime of the organic light emitting device.

The exciton quenching material includes at least one of an alkali metal group ionic compound, a metal salt, a metal oxide, a metal, a high electron affinity organic material, an organic metal complex, and a carbon material. The alkali metal group ionic compounds are the salts, such as lithium fluoride LiF, sodium chloride NaCl, cesium fluoride CsF, etc. Metal salts may be, such as Liq, Alq2, etc. The chemical formula of Liq is 8-hydroxyquinolato-lithium, which is an organometallic complex. The metal oxide may be, for example, MoO3 molybdenum oxide, WO3 tungsten oxide, Al2O3 alumina. The metal material may be, for example, Al aluminum, Ag silver, Au gold, Li lithium, Cs cesium etc. The organometallic complex may be, such as, F4-TCNQ, F16-CuPc, HAT-CN, Pentacene, NDP-9 etc. The carbon material can be, for example, C60, Graphene, carbon nanotube, fullerene, etc. The high electron affinity organic material can be, such as, F4-TCNQ, Liq (8-hydroxy-quinolinato lithium), wherein the chemical formula of F4-TCNQ is tetracyano-quinodimethane, and the chemical formula of Liq is 8-hydroxy-quinolinato lithium. On this occasion, the above exciton quenching materials also help to enhance the hole or electron transport capability of the host material.

Preferably, the exciton quenching material and the host material of the high-energy light sacrificial layer meet the following energy requirements: the gap between the highest occupied molecular orbital of the host material and the lowest unoccupied molecular orbital of the organic material and organic metal complex is 0.6 eV or less; the work function of the alkali metal ionic compound, the metal salt, the metal oxide, the metal, and the carbon material is lower than the lowest unoccupied molecular orbital of the colored light-absorbing material by more than 0.2 eV.

The above-mentioned exciton quenching material and the host material of the high-energy light sacrificial layer will form a so-called charge exchange complex or exciplex after satisfying the above energy requirements. The above state changes can change the optical energy gap of the host material. For example, high electron affinity organic materials or organometallic complexes (F4-TCNQ, F16-CuPc, HAT-CN, Pentacene, NDP-9, etc.) and hole transport materials NPB (N, N'-Bis (naphthalen-1-yl)-N,N'-bis (phenyl)-benzidine) and m-MTDATA (4, 4', 4"-Tris (N-3-methylphenyl-N-phenyl-amino) triphenylamine) have the function of adjusting the optical energy gap. The energy gap of the doped host material is reduced to make the material state more stable, and the hole transport material NPB is the host material of the hole transport function layer.

Embodiment 9

On the basis of the embodiment 7, an exciton quenching material is further added into the high-energy light sacrificial layer of the seventh embodiment. On this occasion, the exciton quenching material is used as the second additional functional material, which is doped in the hole transporting functional layer to improve the charge transport ability. the selection of exciton quenching material can be the same as in the eighth embodiment. In this embodiment, the volume percentage of the exciton quenching material in the high-energy light sacrificial layer is 10%; in other embodiments, the volume percentage of the exciton quenching material in the high-energy light sacrificial layer is more than or equal to 2% and less than or equal to 15%.

Embodiment 10

On the basis of the embodiment 1, the photoluminescent material of the light-absorbing material 80 in the first embodiment is replaced by the exciton quenching material; the selection of exciton quenching material can be the same as in the eighth embodiment. In this embodiment, the volume percentage of the exciton quenching material in the high-energy light sacrificial layer is 8%; in other embodiments, the volume percentage of the exciton quenching material in the high-energy light sacrificial layer is more than or equal to 2% and less than or equal to 15%.

In summary of the above description, in this embodiment, the light-absorbing material includes at least one of a photoluminescent material, a colored light-absorbing material, and an exciton quenching material. In this technical solution, "light-absorbing material" is defined as a material that can absorb high-energy light, wherein the volume percentage of the light-absorbing material in the high-energy light sacrificial layer is more than or equal to 0.1% and less than or equal to 30%.

Embodiment 11

Corresponding to the technical solutions of the above embodiments, this embodiment also provides an embodiment of a method for manufacturing an organic light emitting device, comprising the following steps:

a first electrode, a high-energy light sacrificial layer, a first additional function layer, an light-emitting layer, an electron transport function layer or a hole transport function layer, and a second electrode are sequentially formed on a substrate by any way of vacuum thermal evaporation, wet process, inkjet printing technology, spin coating, and slit coating;

wherein the light-emergent face of the light-emitting layer is located on the side of the first electrode;

alternatively, a first electrode, a high-energy light sacrificial layer, a first additional function layer, an light-emitting layer, an electron transport function layer or a hole transport function layer, and a second electrode are sequentially formed on the substrate by any way of vacuum thermal evaporation, wet process, inkjet printing technology, spin coating, and slit coating;

wherein the light-emergent face of the light-emitting layer is located on the side of the second electrode;

wherein the high-energy light sacrificial layer contains a light-absorbing material that can absorb high-energy light;

wherein the first additional functional layer contains a material that avoids electroluminescence.

The above doping light-absorbing material into the high-energy light sacrificial layer in the OLED device can be implemented by vacuum thermal evaporation to achieve uniform mixture. It is also possible to use a wet process to dissolve the light-absorbing material in a solvent and uniformly mix it with a high molecular semiconductor material or a soluble small molecule semiconductor material (the host material of the electron transport functional layer or the hole transport functional layer), use thin film preparing processes such as inkjet printing technology, spin coating and slit coating to distribute the thin film on the substrate, and then evacuate the solvent by vacuum volatilization or heating volatilization to form a dense and dry high-energy light sacrificial layer.

In summary of the above description, the above first additional functional layer 70 is made by the host material of the high-energy light sacrificial layer or a material which has the similar function. The concept of the same host material is that they have the same charge transport characteristics.

When the light-absorbing material is doped in the hole transport layer HT of the hole transport function layer or when the light-absorbing material layer is adjacent to the hole transport layer HT, the first additional functional layer 70 is the material that can realize the function of hole transport. For example, it can be a different type of HT, such as HT1, HT2, or HT3 etc.

When the light-absorbing material is doped in the hole injection layer HI 31 of the hole transport function layer or when the light-absorbing material layer is adjacent to the hole injection layer HI 31, the first additional functional layer 70 is the material that can realize the function of hole injection.

When the light-absorbing material is doped in the electron blocking layer EBL of the hole transport function layer or when the light-absorbing material layer is adjacent to the electron blocking layer EBL, the first additional functional layer 70 is the material that can realize the function of electron blocking.

When the light-absorbing material is doped in the electron injection layer EI of the electron transport function layer or when the light-absorbing material layer is adjacent to the electron injection layer EI, the first additional functional layer 70 is the material that can realize the function of electron injection.

When the light-absorbing material is doped in the electron transport layer ET of the electron transport function layer or when the light-absorbing material layer is adjacent to the electron transport layer ET, the first additional functional layer 70 is the material that can realize the function of electron transport.

When the light-absorbing material is doped in the hole blocking layer HBL of the electron transport function layer or when the light-absorbing material layer is adjacent to the hole blocking layer HBL, the first additional functional layer 70 is the material that can realize the function of hole blocking.

Therefore, when the high-energy light sacrificial layer is provided in the hole transport function layer, it may be and is not limited to the situations described in table 1 below:

TABLE 1

| Serial Number | Distribution of the Organic Layer (the layers are separated by diagonal bar) |
|---|---|
| 1 | HT1: light-absorbing material/HT1/light-emitting layer/ET |
| 2 | HT2: light-absorbing material/HT2/light-emitting layer/ET |
| 3 | EBL: light-absorbing material/EBL/light-emitting layer/ET |
| 4 | HI/HT: light-absorbing material/HT/light-emitting layer/ET |
| 5 | HT/EBL: light-absorbing material/EBL/light-emitting layer/ET |
| 6 | HI/HT/EBL: light-absorbing material/EBL/light-emitting layer/ET |

Control Experiment 1:

As shown in table 2 below, an experimental group 1 and an experimental group 2 are the ingredient statements of each layer of the organic layer of the OLED panel in the embodiment provided by this application; an control group 1 is the ingredient statement of each layer of the organic layer of the OLED panel in the existing technology of the this application.

TABLE 2

| Experimental Group | the Composition of Each Layer of the Organic Layer |
|---|---|
| Control Group 1 | HI/HT (40 nm)/light-emitting layer/ET |
| Experimental Group 1 | HI/HT: Yellow dopant (20 nm)/HT (20 nm)/light-emitting layer/ET |
| Experimental Group 2 | HI/HT (17 nm)/Yellow dopant (3 nm)/HT (20 nm)/light-emitting layer/ET |

Figure 9:
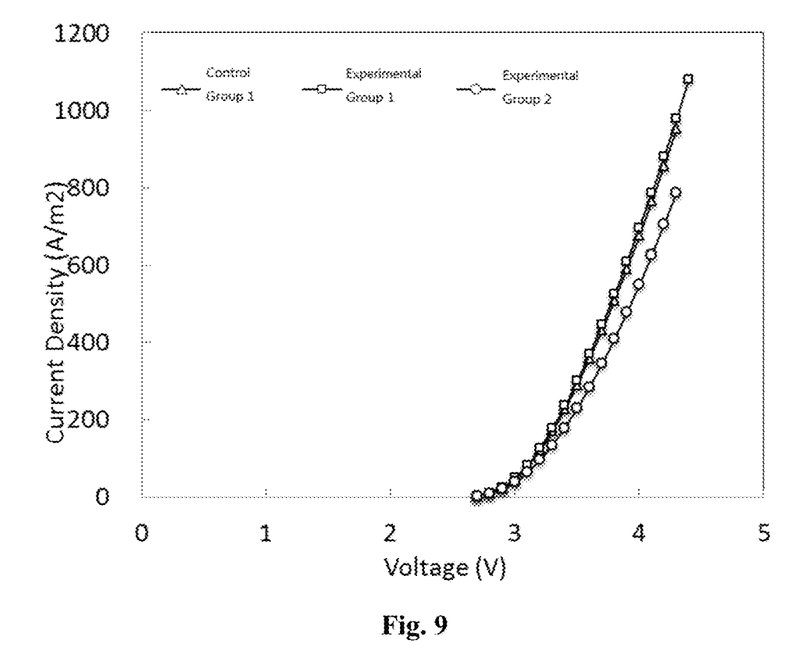
FIG. 9 is a trend chart of instantaneous current and voltage of control group 1, experimental group 1 and experimental group 2 of the present application.
Figure 10:
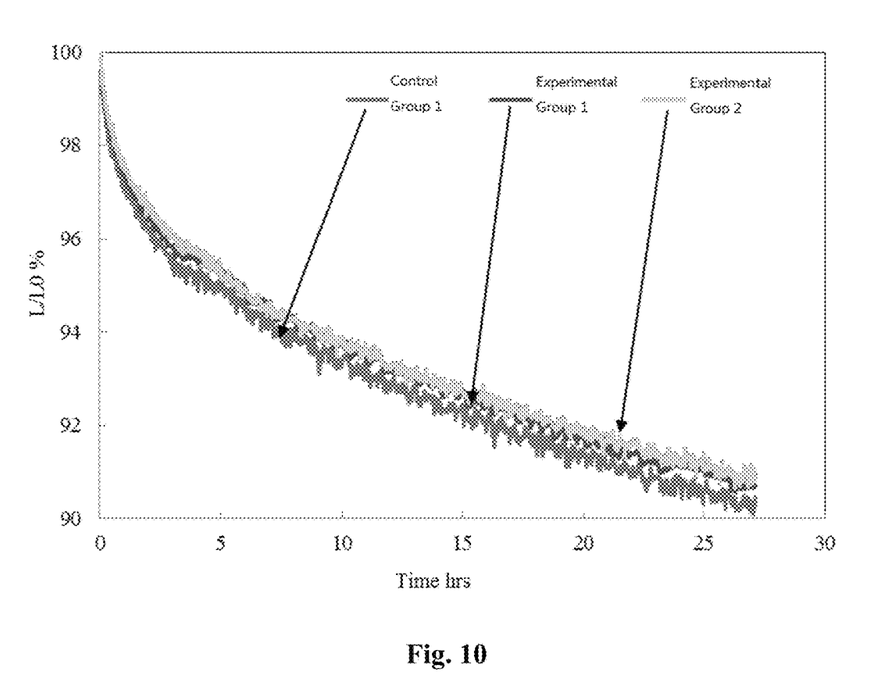
FIG. 10 is a comparison chart of device lifetime of control group 1, experimental group 1 and experimental group 2 of the present application.

The experimental group 1 is based on the control group 1, and the yellow fluorescent material (Yellow dopant) is mixed in the HT layer of the control group 1; the experimental group 2 is a yellow fluorescent material layer of 3 nm thickness on the surface of the HT layer in the control group 1; HT (20 nm) adjacent to the light-emitting layer is used as the first additional function layer in the experimental groups 1 and 2. As shown in FIG. 9, FIG. 10 and table 3, after setting the high-energy light sacrificial layer, the electrical parameters of the panel are relatively close to the control group 1, but the lifetime of the panel has been significantly improved.

TABLE 3

| Condition | Brightness (cd/m²) | Voltage (V) | Current (mA) | Current Efficiency (cd/A) | Power Efficiency (lm/W) | Lifetime (h, T70) |
|---|---|---|---|---|---|---|
| Control Group 1 | 3000.00 | 3.12 | 1.053 | 8.35 | 8.40 | ~9000 |
| Experimental Group 1 | 3000.00 | 3.12 | 1.107 | 8.14 | 8.19 | ~12000 |
| Experimental Group 2 | 3000.00 | 3.22 | 1.254 | 8.19 | 7.98 | ~12500 |

In the above embodiment, the materials of the first additional functional layer 70 of the experimental group 1 and the experimental group 2 are both HT, and the thickness is 20 nm. In other embodiments, the thickness of the first additional functional layer can be more than or equal to 10 nm and less than or equal to 100 nm.

FIG. 10 is a comparison chart of the device lifetime of the control group 1, the experimental group 1 and the experimental group 2. This figure is the case of lighting for a long time under a specific luminance condition and measuring the brightness attenuation at different times. the ordinate in FIG. 10 is the brightness, as can be seen from FIG. 10, at the same time, the brightness of the experimental groups 1 and 2 are brighter than that of the control group 1, which means that the brightness attenuation of the experimental groups 1 and 2 is slower than that of the control group 1. That is to say, the lifetime of the experimental groups 1 and 2 is longer than that of the control group 1.

In the experimental groups 1 and 2, the yellow fluorescent material can also be replaced by other photoluminescence materials.

Control Experiment 2:

As shown in table 4 below, the experimental groups 1 and 3 are the ingredient statements of each layer of the organic layer of the OLED panel in the embodiment provided by this application.

TABLE 4

| Experimental Group | the Composition of Each Layer of the Organic Layer |
|---|---|
| Experimental Group 1 | HI/HT: Yellow dopant (20 nm)/HT (20 nm)/light-emitting layer/ET |
| Experimental Group 3 | HI/HT: Yellow dopant (20 nm): F4-TCNQ/HT (20 nm)/light-emitting layer/ET |

The experimental results of the above experimental groups 1 and 3 are compared as shown in table 5:

TABLE 5

| Condition | Brightness (cd/m²) | Voltage (V) | Current (mA) | Current Efficiency (cd/A) | Power Efficiency (lm/W) |
|---|---|---|---|---|---|
| Experimental Group 1 | 1000.00 | 3.12 | 1.107 | 8.14 | 8.19 |
| Experimental Group 3 | 1000.00 | 2.78 | 1.342 | 8.02 | 9.05 |

The experimental results in the above table 5 indicate that the experimental group 3, which includes an exciton quenching material the p-doped material (F4-TCNQ), showing a significant decrease in operating voltage and a better photoelectric performance when compared with the experimental group 1 at the same brightness. On this occasion, it was also found in this experiment that under the irradiation of same high-energy light, the photoluminescence phenomenon can be observed in the high-energy light sacrificial layer and the light-emitting layer of the experimental group 1, but the photoluminescence phenomenon can't be observed in the light-emitting layer of the experimental group 3. This shows that most of the ultraviolet light is absorbed and quenched by the high-energy light sacrificial layer; therefore, the experimental group 3 is more effective than the experimental group 1 in protecting the light-emitting layer from high-energy light irradiation.

Control Experiment 3:

As shown in table 6 below, the control group 2 is the ingredient statement of each layer of the organic layer of the OLED panel of the existing technology; an experimental group 4 is the ingredient statement of each layer of the organic layer of the OLED panel in one type of the embodiment provided by this application.

TABLE 6

| Control Group 2 | hole injection layer HI (10 nm)/hole transport layer NPB (70 nm)/electron blocking layer EBL (10 nm)/light-emitting layer (35 nm)/HBL hole blocking layer (10 nm)/electron transport layer ET (30 nm) |
|---|---|
| Experimental Group 4 | hole injection layer HI (10 nm)/high-energy light sacrificial layer (70 nm)/electron blocking layer EBL (10 nm)/light-emitting layer (35 nm)/HBL hole blocking layer (10 nm)/electron transport layer ET (30 nm) |

The structure of the high-energy light sacrificial layer in the above experimental group 4 is NPB: F4-TCNQ: Rubrene, the three are doped according to the optimized ratio; Rubrene is a fluorescent dye.

Figure 11:
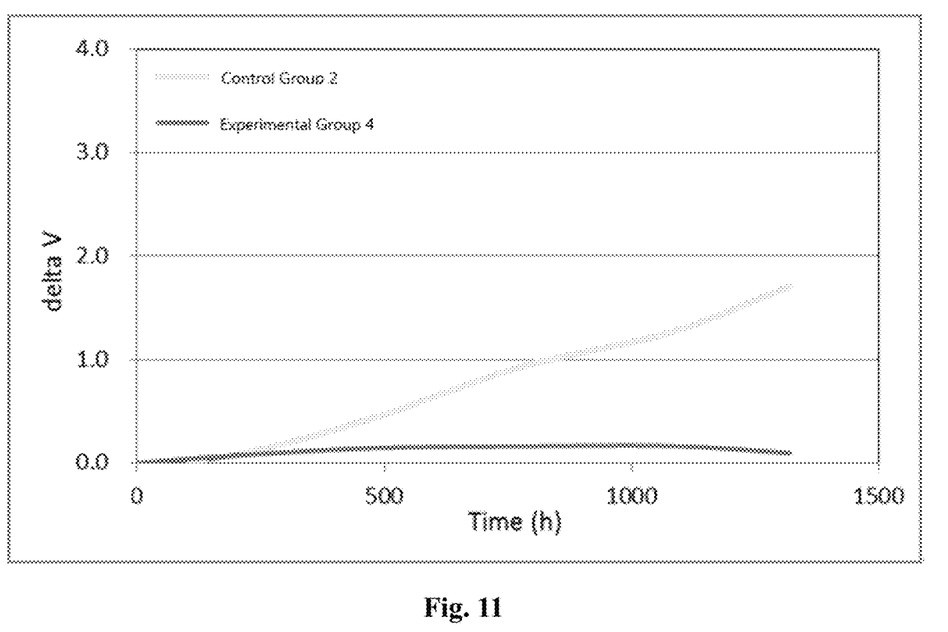
FIG. 11 is a comparison chart of the experimental results of control group 2 and experimental group 4 of the present application.

The two panels of the control group 2 and the experimental group 4 were exposed to simulated sunlight for 1,300 hours, and photoelectric characteristics were measured every 48 hours. As shown in FIG. 11, the experimental results show that the experimental group 4 has stable photoelectric characteristics after long-term irradiation; in the control group 2, the voltage of the same current density increase by 1.7 V due to the influence of irradiation, and nonuniformity occurs based on the area, showing the obvious effect of the high-energy light sacrificial layer.

Control Experiment 4:

Experimental groups 5-9 of the control experiment correspond to the embodiments provided in this application. In this control experiment, the device structure of the OLED panel of each embodiment is ITO-glass/NPB:Rubrene:F4-TCNQ (x nm)/NPB (250-x nm)/ET (15 nm)/EML/ET/Al, where x is the thickness of the high-energy light sacrificial layer. ITO-glass is the first electrode, NPB:Rubrene:F4-TCNQ (x nm)/NPB (250-x nm) is the hole transport function layer of the doped fluorescent dye Rubrene and the exciton quenching material F4-TCNQ; ET (15 nm) is the first additional functional layer; EML is the light-emitting layer; ET is the electron transport function layer; Al is the second electrode; the values of x corresponding to the above experimental groups 5-9 are 10 nm, 30 nm, 100 nm, 200 nm, 250 nm, respectively.

The host material of the high-energy light sacrificial layer in the above experimental groups 5-9 is the hole transport material NPB; the light-absorbing material uses the fluorescent dye Rubrene (the concentration is 2%); the exciton quenching material uses F4-TCNQ (the concentration is 8%).

The OLED panels of the above experimental groups 5-9 are irradiated and stored under the simulated sunlight of 1000 W/m^2 (the ultraviolet intensity at a wavelength of 300 nm-400 nm is 30 W/m^2) for 600 hours, the results of driving voltage at the same current are shown in table 7 below:

TABLE 7

| | Experimental Group | | | | |
|---|---|---|---|---|---|
| | Experimental Group 5 | Experimental Group 6 | Experimental Group 7 | Experimental Group 8 | Experimental Group 9 |
| Thickness of the High-energy Light Sacrificial Layer | 10 nm | 30 nm | 100 nm | 200 nm | 250 nm |
| Initial Voltage (V) | 4.32 | 4.28 | 4.23 | 4.25 | 4.30 |
| After 120 h (V) | 4.79 | 4.41 | 4.26 | 4.24 | 4.27 |
| After 240 h (V) | 5.33 | 4.65 | 4.25 | 4.22 | 4.25 |
| After 600 h (V) | 7.43 | 5.03 | 4.38 | 4.37 | 4.21 |
| Voltage Change ΔV | 3.11 | 0.75 | 0.15 | 0.12 | −0.09 |

The above experimental results indicate that the thickness of the high-energy light sacrificial layer above 30 nm starts to improve the photoelectric performance of the OLED panel.

Control Experiment 5:

This experiment is mainly used to test the effect of different concentrations of exciton quenching materials on the photoelectric performance of the OLED panel.

As shown in table 8 below, experimental groups 10-13 are the ingredient statements of each layer of the organic layer of the OLED panel in the embodiment provided by this application. The following "prime" represents the first additional function layer. Table 9 is a comparison statement of the photoelectric characteristics of each group of OLED panels corresponding to this control experiment.

TABLE 8

| Experimental Group 10 | m-TDATA: F4-TCNQ (the concentration is 2%, 10 nm)/m-TDATA (140 nm)/prime (15 nm)/EML/ET |
|---|---|
| Experimental Group 11 | m-TDATA: F4-TCNQ (the concentration is 2%, 150 nm)/prime (15 nm)/EML/ET |
| Experimental Group 12 | m-TDATA: F4-TCNQ (the concentration is 10%, 150 nm)/prime (15 nm)/EML/ET |
| Experimental Group 13 | m-TDATA: F4-TCNQ (the concentration is 20%, 150 nm)/prime (15 nm)/EML/ET |

TABLE 9

| | Experimental Group | | | |
|---|---|---|---|---|
| | Experimental Group 10 | Experimental Group 11 | Experimental Group 12 | Experimental Group 13 |
| Initial Voltage (V) | 4.25 | 3.91 | 3.88 | 3.96 |
| After 120 h (V) | 4.77 | 4.03 | 3.92 | 3.95 |
| After 240 h (V) | 5.49 | 4.22 | 3.94 | 3.95 |
| Voltage Change ΔV | 1.24 | 0.31 | 0.06 | −0.01 |

Exciton quenching materials generally have the effect of enhancing the charge transport capability. The exciton quenching materials in this experimental group are generally used to improve the charge transport capability; in this technology field, the doping concentration of the material used to enhance the charge transport capability is generally around 2%, which can significantly improve the charge transport capability.

In this experiment, It was found that further increasing the concentration of the materials, i.e. the exciton quenching material, which improve the charge transport capability, for example, when the concentration is increased to the range of 2-10%, the effect on the photoelectric transporting performance of the OLED panel is below 10%, but the charge transport capability is improved by at least two orders of magnitude. In addition, in the above experimental groups 10-13, when the hole transport function layer was obtained by doping the hole transport material m-TDATA, which has an optical energy gap of about 2.91 electron volts, with the high electron affinity material F4-TCNQ, the concentration of F4-TCNQ is about 2-10%. When the structure of the hole transport function layer is m-TDATA:F4-TCNQ (20%, 150 nm), its optical energy gap decreases from 2.91 to 2.55 electron volts from calculation. The color of the film changes from nearly transparent to yellowish by visually check; after preparing the device, the characteristics under irradiation condition are compared; when the OLED panel is irradiated and stored under the simulated sunlight of 1000 W/m^2 (the ultraviolet intensity at a wavelength of 300 nm-400 nm is 30 W/m^2), the stability of the panel is significantly improved, and the voltage has no significant change during the measurement time. That is to say, this experimental group shows that the high concentration of the exciton quenching material doped solely in the hole transport functional layer or electron transport functional layer can not only play the role of exciton quenching, but also play the role of charge boosting, and the excess light-absorbing material can further block high-energy light.

The doped exciton quenching material causes a large amount of charge present in the doped electron transport function layer and hole transport function layer; there are a large number of excitons in the light-emitting layer in theory, and the excitons dominate the luminous efficiency and luminescent characteristics; however, excitons can easily interact with charges, and this interaction can easily quench the excitons. Excitons easily interact with charges, but the formation of excitons also starts with charges (holes and electrons enter into the light-emitting layer respectively, and the excited state before electron and hole's recombination luminescence is called exciton); therefore, the first additional functional layer has the same carrier transport characteristics as the electron transport functional layer or the hole transport functional layer, but the characteristics are worse than the doped layer. Thus the accumulation of charge occurs at the interface between the high-energy light sacrificial layer and the first additional functional layer, while at the same time supplying the charge required by the light-emitting layer to generate excitons. Because of the separation of the first additional functional layer, the quenching effect caused by the interaction between excitons and charges can be effectively reduced. Therefore, the first additional function layer designed in the above embodiments of the present application may also be called a protection layer; when the carrier transmission characteristics there of are consistent with the carrier transmission characteristics of the doped transport function layer, the interaction between charge and excitons can be reduced, and the exciton can be confined in the light-emitting layer, avoiding the occurrence of quenching.

Control Experiment 6:

As shown in table 10 below, an experimental group 14 and an experimental group 15 are the ingredient statements of each layer of the organic layer of the OLED panel in the embodiment provided by this application; the control group 1 is the ingredient statement of each layer of the organic layer of the OLED panel in the existing technology of the this application.

TABLE 10

| Experimental Group | the Composition of Each Layer of the Organic Layer |
|---|---|
| Control Group 1 | HI/HT (40 nm)/light-emitting layer/ET |
| Experimental Group 14 | HI/HT: 2-(2'-xenyl 3',5'-di-pentylphenyl) benzotriazole (20 nm)/HT (20 nm)/light-emitting layer/ET |
| Experimental Group 15 | HI/HT (17 nm)/2-(2'-xenyl 3',5'-di-pentylphenyl) benzotriazole (3 nm)/HT (20 nm)/light-emitting layer/ET |

The experimental group 14 is based on the control group 1, and the colored light-absorbing material (2-(2'-xenyl 3',5'-di-pentylphenyl) benzotriazole) is mixed in the HT layer of the control group 1; the experimental group 15 is a colored light-absorbing material layer of 3 nm thickness on the surface of the HT layer in the control group 1; HT (20 nm) adjacent to the light-emitting layer is used as the first additional function layer in the experimental groups 14 and 15. As shown in table 11, after setting the high-energy light sacrificial layer, the electrical parameters of the panel are relatively close to the control group 1, but the lifetime of the panel has been significantly improved.

TABLE 11

| Condition | Brightness (cd/m$^2$) | Voltage (V) | Current (mA) | Current Efficiency (cd/A) | Power Efficiency (lm/W) | Lifetime (h, T70) |
|---|---|---|---|---|---|---|
| Control Group 1 | 3000.00 | 3.12 | 1.053 | 8.35 | 8.40 | ~9000 |
| Experimental Group 14 | 3000.00 | 3.15 | 1.117 | 8.16 | 8.03 | ~12100 |
| Experimental Group 15 | 3000.00 | 3.20 | 1.220 | 8.20 | 7.78 | ~12600 |

In the experimental groups 14 and 15, 2-(2'-xenyl 3',5'-di-pentylphenyl)benzotriazole can also be replaced by 2-xenyl-4-n-octyloxy benzophenone or other light-absorbing materials.

Control experiment 7:

As shown in table 12 below, the experimental group 14 and an experimental group 16 are the ingredient statements of each layer of the organic layer of the OLED panel in the embodiment provided by this application.

TABLE 12

| Experimental Group | the Composition of Each Layer of the Organic Layer |
|---|---|
| Experimental Group 14 | HI/HT: 2-(2'-xenyl 3',5'-di-pentylphenyl)benzotriazole (20 nm)/HT (20 nm)/light-emitting layer/ET |
| Experimental Group 16 | HI/HT: 2-(2'-xenyl 3',5'-di-pentylphenyl)benzotriazole (20 nm): F4-TCNQ/HT (20 nm)/light-emitting layer/ET |

The experimental results of the above experimental groups 14 and 16 are compared as shown in table 13,

TABLE 13

| Condition | Brightness (cd/m$^2$) | Voltage (V) | Current (mA) | Current Efficiency (cd/A) | Power Efficiency (lm/W) |
|---|---|---|---|---|---|
| Experimental Group 14 | 1000.00 | 3.12 | 1.107 | 8.14 | 8.19 |
| Experimental Group 16 | 1000.00 | 2.81 | 1.256 | 8.05 | 9.01 |

The experimental results in the above table 13 indicate that the experimental group 16, which includes an exciton quenching material, i.e. the p-doped material (F4-TCNQ), shows a significant decrease in operating voltage and a better photoelectric performance when compared with experimental group 14 at the same brightness. At the same time, it was also found in the experiment that under the same irradiation of the high-energy light, the photoluminescence phenomenon can be observed in the high-energy light sacrificial layer and the light-emitting layer in the experimental group 14, but the photoluminescence phenomenon can't be observed in the light-emitting layer in the experimental group 16. This shows that most of the ultraviolet light is absorbed and quenched by the high-energy light sacrificial layer; therefore, the experimental group 16 is more effective than the experimental group 14 in protecting the light-emitting layer from high-energy light irradiation.

In the technical solution of the present application, the photoluminescent material and the colored light-absorbing material can also be used in the high-energy light sacrificial layer at the same time. For example, a fluorescent dye is added to HT: 2-(2'-xenyl 3',5'-di-pentylphenyl)benzotriazole (20 nm) layer in the experimental group 14; or a phosphorescent dye is added to HT: 2-(2'-xenyl 3',5'-di-pentylphenyl)benzotriazole (20 nm) layer in the experimental group 16.

The design principles of the high-energy light sacrificial layer provided in the above embodiments are applicable to various types of OLED light-emitting devices, including primary single light-emitting layer devices, stacked devices, inverted devices, and top-emitting devices.

For example, the hole injection material commonly used in the industry can be used together with the conventional commercial material NDP-9 and the fluorescent material Rubrene by co-evaporation to obtain the high-energy light sacrificial layer at the side of hole transporting, wherein the high-energy light sacrificial layer adopts a method of absorbing radiation to block high-energy light and improve the hole transport capability.

The common electron transport material Bphen can also be co-evaporated with a specific ratio of metallic silver to complete the design of the high-energy light sacrificial layer at the side of electron transporting, wherein the high-energy light sacrificial layer adopts Bphen and silver complex to improve the electron transmission characteristics, and some silver atoms do not react with organic molecules, and have the ability to absorb light irradiation.

In the experiment, different types of high-energy light sacrificial layers with 50 nm were placed on the light-exiting side for single light-emitting layer devices, stacked devices, inverted devices, and top-emitting devices according to the device structure; after storing for 500 hours under the simulated sunlight, the voltage rise of all panels is less than 0.5V; however, the control panel without the high-energy light sacrificial layer structure has a voltage change above 1V, and because of the nonuniform light exposured, there is a serious nonuniform distribution of light and dark.

The above description is merely preferred embodiments of the present application and a description of principles of the applied technology. It should be understood by those skilled in the art that the scope of the disclosure covered in the present application is not limited to a specific combination of the above technical features. It should further cover other technical solutions formed by any combination of the above technical features or equivalent features thereof without departing from the disclosed concept. For example, the above features and the technical features disclosed in the present application (but not limited to) with similar functions are replaced by each other to form a technical scheme.

What is claimed is:

1. An organic light emitting device comprising a substrate, a first electrode, an organic layer, a second electrode, and a packaging structure that are sequentially stacked, wherein a light-emergent face of the organic light emitting device is located on the side of the first electrode or the second electrode;
    wherein the organic layer comprises a hole transport function layer, an electron transport function layer and a light-emitting layer between the hole transport function layer and the electron transport function layer;
    wherein the organic light emitting device further comprises a high-energy light sacrificial layer between the first electrode or the second electrode where the light-emergent face of the organic light emitting device is located and the light-emitting layer, wherein the high-energy light sacrificial layer is configured to absorb light whose photons have energy above a threshold;
    wherein the organic light emitting device further comprises a first additional functional layer configured to prevent electroluminescence in the high-energy light sacrificial layer and located between the high-energy light sacrificial layer and the light-emitting layer.

2. The organic light emitting device according to claim 1, wherein the high-energy light sacrificial layer is in the hole transport function layer and the hole transport function layer is a host doped with a light-absorbing material, or wherein the high-energy light sacrificial layer is in the electron transport function layer and the electron transport function layer is a host doped with a light-absorbing material.

3. The organic light emitting device according to claim 1, wherein the high-energy light sacrificial layer comprises the hole transport function layer and a layer of a light-absorbing material located in or on the hole transport function layer, or wherein the high-energy light sacrificial layer comprises the electron transport function layer and a layer of a light-absorbing material located in or on the electron transport function layer.

4. The organic light emitting device according to claim 2, wherein the light-absorbing material includes at least one of a photoluminescent material, a colored light-absorbing material, and an exciton quenching material.

5. The organic light emitting device according to claim 4, wherein the lowest energy starting position of the absorption spectrum of the photoluminescent material is higher than the highest energy dominant peak energy position of the emission spectrum of the light-emitting layer material and lower than the optical energy gap of a host material of the high-energy light sacrificial layer.

6. The organic light emitting device according to claim 4, wherein the photoluminescent material is any one of a fluorescent material, a phosphorescent material or a quantum dot light-emitting material.

7. The organic light emitting device according to claim 4, wherein the volume percentage of the light-absorbing material in the high-energy light sacrificial layer is more than or equal to 0.1% and less than or equal to 30%.

8. The organic light emitting device according to claim 7, wherein the volume percentage of the photoluminescent material in the high-energy light sacrificial layer is more than or equal to 0.1% and less than or equal to 15%.

9. The organic light emitting device according to claim 7, wherein the volume percentage of the colored light-absorbing material in the high-energy light sacrificial layer is more than or equal to 0.1% and less than or equal to 10%.

10. The organic light emitting device according to claim 7, wherein the volume percentage of the exciton quenching material in the high-energy light sacrificial layer is more than or equal to 2% and less than or equal to 15%.

11. The organic light emitting device according to claim 4, wherein the colored light-absorbing material includes at least one of a salicylate, a benzophenone, a benzotriazole, a substituted acrylonitrile, a triazine, a direct dye, a basic dye, an acid dye, a disperse dye, a reactive dye, a sulfur dye, a vat dye and a cationic dye.

12. The organic light emitting device according to claim 11, wherein the colored light-absorbing material includes at least one of 2-(2'-xenyl 3',5'-di-pentylphenyl) benzotriazole and 2-xenyl-4-n-octyloxybenzophenone.

13. The organic light emitting device according to claim 4, wherein the exciton quenching material includes at least one of an alkali metal group ionic compound, a metal salt, a metal oxide, a metal, a high electron affinity organic material, a high electron affinity organic metal complex, and a carbon material.

14. The organic light emitting device according to claim 4, wherein the exciton quenching material and a host material of the high-energy light sacrificial layer meet the following energy requirements: the gap between the highest occupied molecular orbital of the host material and the lowest unoccupied molecular orbital of the organic material and organic metal complex is 0.6 eV or less; the work function of the alkali metal ionic compound, the metal salt, the metal oxide, the metal, and the carbon material is lower than the lowest unoccupied molecular orbital of the colored light-absorbing material by more than 0.2 eV.

15. The organic light emitting device according to claim 1, wherein the material of the first additional functional layer has the same charge transport characteristics as a host material of the high-energy light sacrificial layer.

16. The organic light emitting device according to claim 1, wherein the thickness of the first additional function layer is more than or equal to 10 nm and less than or equal to 100 nm.

17. The organic light emitting device according to claim 1, wherein the thickness of the high-energy light sacrificial layer is more than or equal to 30 nm and less than or equal to 250 nm.

18. A method for manufacturing an organic light emitting device, comprising the following steps: a first electrode, a high-energy light sacrificial layer, a first additional function layer, a light-emitting layer, an electron transport function layer or a hole transport function layer, and a second electrode are sequentially formed on a substrate by any way of vacuum thermal evaporation, wet process, inkjet printing technology, spin coating, and slit coating;
   wherein the light-emergent face of the light-emitting layer is located on the side of the first electrode;
   alternatively, a first electrode, a high-energy light sacrificial layer, a first additional function layer, an light-emitting layer, an electron transport function layer or a hole transport function layer, and a second electrode are sequentially formed on the substrate by any way of vacuum thermal evaporation, wet process, inkjet printing technology, spin coating, and slit coating;
   wherein the light-emergent face of the light-emitting layer is located on the side of the second electrode;
   wherein the high-energy light sacrificial layer contains a light-absorbing material that can absorb high-energy light;
   wherein the first additional functional layer contains a material that avoids electroluminescence.

* * * * *